United States Patent [19]

Lenz

[11] 4,414,686

[45] Nov. 8, 1983

[54] COMPENSATION OF NONLINEARITIES OF TRANSMISSION MEMBERS IN A RADIO RELAY SYSTEM

[75] Inventor: Sigmund Lenz, Aspach, Fed. Rep. of Germany

[73] Assignee: Licentia Patent-Verwaltungs-GmbH, Frankfurt am Main, Fed. Rep. of Germany

[21] Appl. No.: 363,949

[22] Filed: Mar. 31, 1982

[30] Foreign Application Priority Data

Apr. 1, 1981 [DE] Fed. Rep. of Germany ....... 3113005

[51] Int. Cl.³ .......................... H04B 7/14; H04B 1/10; H04B 1/26
[52] U.S. Cl. ..................................... 455/20; 455/118; 455/302; 455/323
[58] Field of Search ..................................... 455/20–22, 455/47, 63, 114, 118, 109, 302, 318, 319, 323; 332/37 R

[56] References Cited

U.S. PATENT DOCUMENTS

| 2,964,622 | 12/1960 | Fire | 455/302 |
| 3,202,928 | 8/1965 | Prior | 455/114 |
| 4,346,479 | 8/1982 | Weber | 455/22 |

FOREIGN PATENT DOCUMENTS 2743352  3/1979  Fed. Rep. of Germany ........ 455/22

*Primary Examiner*—Jin F. Ng
*Attorney, Agent, or Firm*—Spencer, Kaye & Frank

[57] ABSTRACT

A method for compensating nonlinearities of a transmission member in a radio relay transmission system by means of a linear converter having a linear gain characteristic and a harmonic generator converter having a nonlinear characteristic, in which an intermediate frequency signal modulated a useful signal is converted by a local oscillator signal into a radio frequency signal and the output signals of the two converters are linked together by a network. The method further includes: setting the operating point of the harmonic generator converter in a manner to cause its output signal to be essentially composed of components corresponding to the useful signal and to third order intermodulation products thereof; modifying the harmonic generator converter output signal by substantially suppressing the useful signal component from that output signal and setting the amplitude of the remaining third order intermodulation products component of that output signal; setting a relative phase position between the modified output signal of the harmonic generator converter and the output signal of the linear converter; and combining the modified output signal of the harmonic generator converter and the output signal of the linear converter subsequent to setting the relative phase position.

14 Claims, 9 Drawing Figures

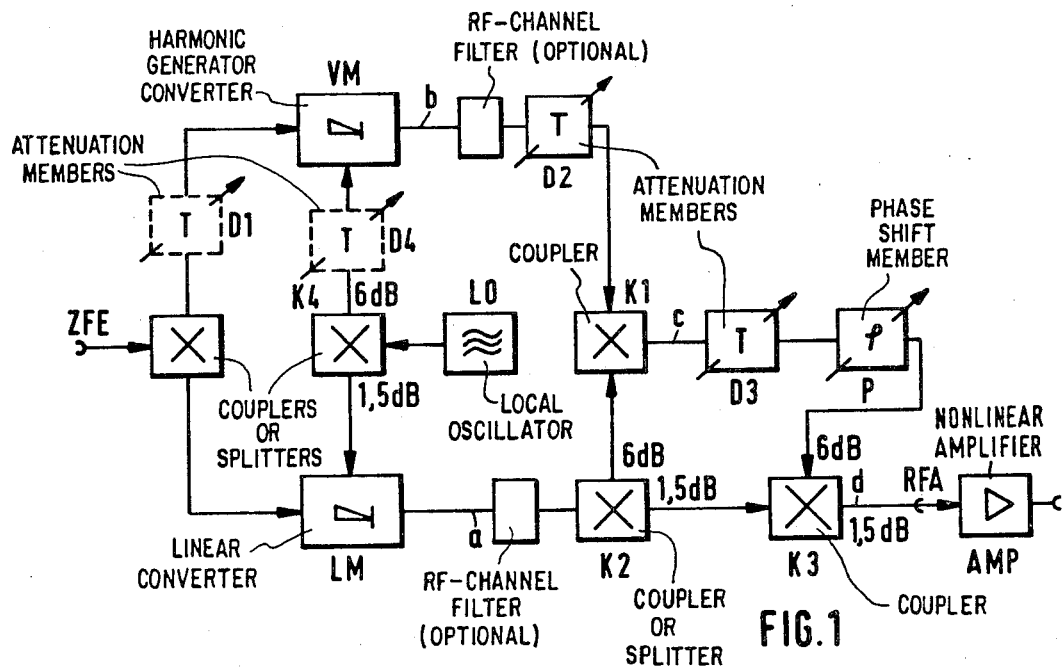
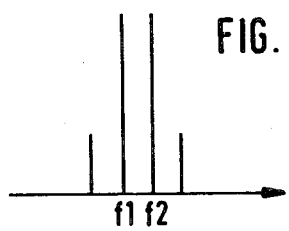
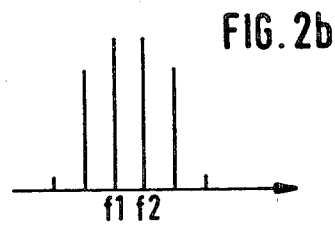
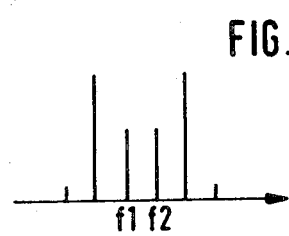
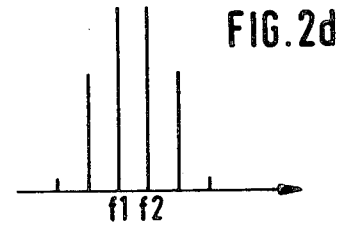

EXAMPLE FOR A
"SELF-BIASING" NETWORK

BIAS FOR EACH DIODE

BIAS WITH EXTERNAL VOLTAGE-SOURCE

COMPENSATION OF NONLINEARITIES OF TRANSMISSION MEMBERS IN A RADIO RELAY SYSTEM

BACKGROUND OF THE INVENTION

The present invention relates to a method and circuit arrangement for compensating nonlinearities of transmission members in a radio relay transmission system by a converter operating in the linear and distorting, or harmonic, ranges.

The transmission of amplitude modulated signals over radio relay paths requires high linearity in the microwave transmitting amplifier. This linearity cannot be realized in the amplifier itself.

The problem can be solved in two ways: firstly, according to the predistortion method; and secondly according to the older preliminary deaccentuation, or feed forward, method.

Usually, the latter type of linearization is not used for broadband deaccentuator circuits because of the high costs involved.

Circuits operating according to the feed forward principle are used either in the intermediate frequency plane or in the radio frequency plane, the latter having a smaller relative bandwidth but usually also high transmission losses of about 7 to 10 dB which must be compensated with an additional microwave amplifier, for example an FET amplifier.

German Offenlengungsschrift [Laid-Open Application] No. 2,923,046 and corresponding U.S. Application Ser. No. 157,172 filed by Weber on June 6th, 1980, now U.S. Pat. No. 4,346,479, issued Aug. 24, 1982, also discloses a converter arrangement with predistortion in the RF plane in which the harmonic generator converter receives the local oscillator signal via a level and phase regulator and the converter output signals are combined in a summing member. A drawback of this circuit arrangement, however, is that, depending on the phase position of the annoying nonlinearity, the phase of the oscillator signal must be shifted for the harmonic generator converter to such an extent that the useful output signal of the harmonic generator converter reaches the range of the opposite phase to the HF output signal of the linear converter, which may likewise create high losses.

SUMMARY OF THE INVENTION

It is therefore an object of the present invention to provide a method and circuit arrangement for compensating nonlinearities of transmission members in a radio relay transmission system of the above-mentioned type in such a manner that the transmission losses are kept very low and, moreover, the distortion level can be set very easily and good total deaccentuation can be accomplished at low cost.

The above and other objects are achieved, according to the invention, in a method for compensating nonlinearities of a transmission member in radio relay transmission system by means of a linear converter having a linear gain characteristic and a harmonic generator converter having a nonlinear characteristic, in which an intermediate frequency signal modulated with a useful signal is converted by combination with a local oscillator signal into a radio frequency signal and the output signals of the two converters are linked together by a network, by the steps of: setting the operating point of the harmonic generator converter in a manner to cause its output signal to be essentially composed of components corresponding to the useful signal and to third order intermodulation products thereof; modifying the harmonic generator converter output signal by substantially suppressing the useful signal component from that output signal and setting the amplitude of the remaining third order intermodulation products component of that output signal; setting relative phase position between the modified output signal of the harmonic generator converter and the output signal of the linear converter; and combining the modified output signal of the harmonic generator converter and the output signal of the linear converter subsequent to setting the relative phase positon.

The invention offers the advantages of a good, economical compensation of the nonlinearity of a directional radio relay transmission member, particularly a traveling wave tube, while utilizing the small relative bandwidth and without incurring high transmission losses. Moreover, it is of great advantage that the circuit arrangement according to the invention can be produced in integrated form so that space requirements and manufacturing costs can be kept at a minimum.

The invention is based on the realization that, particularly in traveling wave tube transmitting amplifiers, the nonlinearity exhibits essentially intermodulation signals of the third order. The present invention makes it possible to produce the same conversion products with the harmonic generator converter, to separate them from the useful signal components of its RF signal and to adjust them in amplitude and phase and add them again to the useful RF signal in such a way that the RF output signal of the transmitting amplifier no longer contains any interfering converter products.

The invention will be described below with the aid of the drawing figures.

BRIEF DESCRIPTION OF THE DRAWING

FIG. 1 is a block circuit diagram of the preferred embodiment of the compensation circuit arrangement according to the invention.

FIGS. 2a through 2d are spectral diagrams of the signal amplitudes at four different points of the circuit arrangement of FIG. 1.

DESCRIPTION OF THE PREFERRED EMBODIMENTS

Figure 3A:
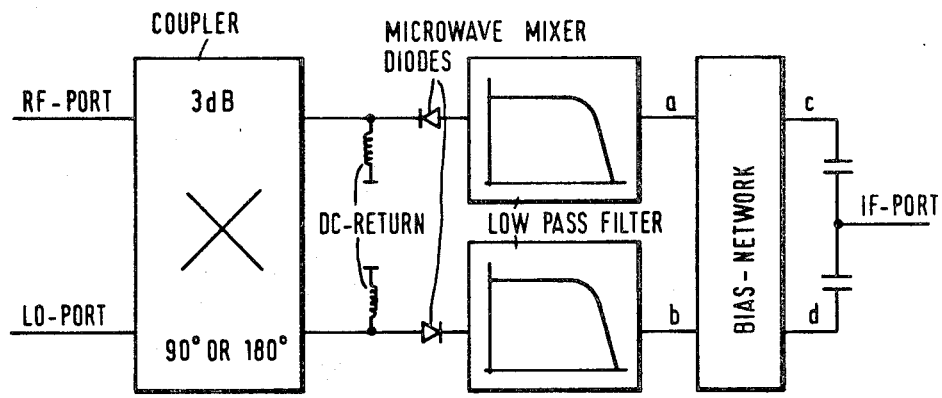
FIG. 3a is a circuit diagram of an upconverter, which is used for generation of harmonics.

The block circuit diagram of FIG. 1 shows a circuit arrangement containing a linear converter LM and a harmonic generator VM, which are both supplied, via an IF input ZFE and a coupler, or splitter (not shown in detail), with the intermediate frequency signal, and which are both supplied, via a coupler, or splitter, K4, with the signal produced by a local oscillator LO. The 6-dB output of the coupler K4 is used for oscillator drive of the harmonic generator converter VM. The working point of this converter is set so that the converter works in its nonlinear region thus exhibiting a strong nonlinearity. By adjustment of the series-connected attenuation member D4, the nonlinearity of the harmonic generator converter can be varied even further.

In order to determine the nonlinearity behavior of the microwave amplifier, the known two-tone intermodulation measuring method is employed. In this method, two tones, at respective frequencies, f1 and f2 having a separation Δf within the intermediate frequency band, are fed through the IF input ZFE to the converter arrangement. At the output a of the linear converter LM there then appears the spectrum shown in FIG. 2a whose lines include: the two tones at frequencies f1, f2 which have been converted into the radio relay band; and the interfering third order conversion products 2f2-f1 or 2f1-f2, respectively. At the output b of the harmonic generator converter VM there appears the spectrum shown in FIG. 2b in which a reduction of the useful signal level, corresponding to frequencies f1 and f2 can be seen, together with a clear increase in amplitudes of the third order conversion products as well as appearance of low level fifth order products. The undesirable fifth order components can be substantially suppressed by appropriate setting of the operating point, i.e. by adjusting the variable resistance in the d.c. circuit of the microwave mixing diode, of the harmonic generator converter and by appropriately adjusting attenuation members D1 and D4 in the IF and LO branch.

In order to separate the third order conversion products, a further coupler K1 is provided in which are combined, in phase opposition, the output signal from the harmonic generator converter VM and a small proportion of the output signal from the linear converter LM which has been coupled out of converter LM via a further coupler, or splitter, K2. If the coupling attenuation is selected correctly, this may extinguish or cancel the useful signals. For better tuning, or matching, a further attenuation member D2 must be included between the output of the harmonic generator VM converter and the coupler K1.

At the output c of the coupler K1 there appears a signal exhibiting the spectrum shown in FIG. 2c which clearly shows the excess height of the third order converter products compared to the greatly suppressed useful signal tones. This output signal is then set in amplitude and phase by means of a subsequent attenuation member D3 and a phase shift member P and is added via a 6-dB input of a further coupler K3 to the linear converter output signal which passes through the splitter K2. At the output d of the coupler K3, which is connected to a nonlinear microwave transmitting amplifier AMP, there appears the sum signal exhibiting the spectrum shown in FIG. 2d, which clearly shows the third order modulation products that have been increased in amplitude compared to the full useful signal level.

The above-described arrangement has very low RF transmission losses of 2×1.5 dB.

In a 6 GHz radio relay device, having a channel bandwidth of about 40 MHz, employing 10 Watt traveling wave tube amplifiers (e.g. tube YH 1202) a reduction in annoying third order converter product components of more than 20 dB could be realized, making a signal to noise ratio of more than 70 dB a distinct possibility.

In the realized circuit arrangement, the converter arrangements were single sideband converters in which the oscillator signal and the undesired sideband are suppressed by more than 15 dB compared to the useful sideband. The method according to the invention or the arrangement, respectively, is, however, not limited to single sideband converters; double sideband converters can of course also be used.

With very high output levels in the traveling wave tube amplifiers, the third order intermodulation products may take on disproportionately high values which exceed the values that can be realized with a harmonic generator converter so that compensation is no longer possible. For such extreme cases, the necessary levels can be generated by a plurality of parallel operating harmonic generator converters.

For generation of the nonlinear function of the harmonic generator converter VM, a "single balanced mixer" shown in FIG. 3a may be used, for example.

RF- and LO-parts are decoupled by a 3dB-coupler (90° or 180°) whose coupling ports are terminated with mixer diodes. The operation point of the mixer firstly is determined by the LO-drive-power, secondly by the bias current flowing through the diodes, and thirdly by the IF-power-level. If $P_{LO} \gtrsim P_{IF}$, the mixer works in its nonlinear region (compression region) and the intermodulation signals appearing at the RF-part may be tuned by the bias current.

Figure 3B:
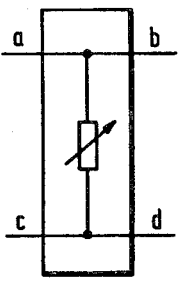
FIG. 3b, c and 3d are circuit diagrams of three arrangements for biasing of the mixer diodes.
Figure 3D:
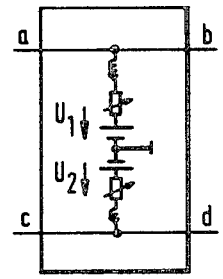
Figure 3C:
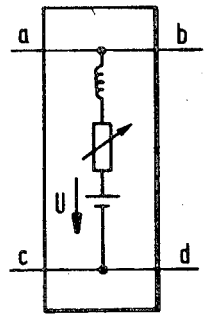

Three methods for biasing of mixer diodes are shown in FIG. 3b to d. In FIG. 3b an example for a self-biasing network is shown. FIG. 3c and d show examples with external voltage-sources whereby both diodes are biased separately in FIG. 3d.

The intermodulation spectrum at point d (FIG. 1) must have the same $3^{rd}$ order intermodulation distance (amplitude distance between fundamental and $3^{rd}$ order signals) compared to that measured at the output of the nonlinear amplifier AMP in the nonpredistorted case. If the phase of the intermodulation signals generated by the upconverter network configuration are in opposition to those generated by the amplifier AMP a cancellation of the distortion products results at the output of the amplifier AMP.

Converters using the image frequency cancellation principle are described in J. B. Cochrane, "Thin-Film Mixers Team Up to Block out Image Noise", Microwaves, March 1977, pp. 34–40, 84 and in J. F. Reynolds, M. R. Rosenzweig, "Learn the Language of Mixer Specification", Microwaves, May 1978, pp. 72–80.

If mixers without image frequency rejection and oscillator suppression are applied, RF bandpass, or channel, filters may be used for selecting the wanted sideband. Those filters, which can be inserted, as shown in FIG. 1, in the branches a and b (or c) or a single one in branch d, are described for example in S. B. Cohn, "Direct-coupled-Resonator-Filters" Proc. IRE Feb. 1957, pp. 187.

It will be understood that the above description of the present invention is susceptible to various modifications, changes and adaptations, and the same are intended to be comprehended within the meaning and range of equivalents of the appended claims.

What is claimed is:

1. In a method for compensating nonlinearities of a transmission member of a radio relay transmission system by means of a linear converter having a linear gain characteristic and a harmonic generator converter having a nonlinear gain characteristic, which method includes supplying an intermediate frequency signal modulated with a useful signal and a local oscillator signal to respective inputs of each converter to cause each converter to produce a radio frequency output signal, and linking the output signals of the two converters together in a network, the improvement comprising: setting the operating point of the harmonic generator converter in a manner to cause its output signal to be essentially composed of components corresponding to the useful signal and to third order intermodulation products thereof; modifying the harmonic generator converter output signal by substantially suppressing the useful signal component from that output signal and setting the amplitude of the remaining third order intermodulation products component of that output signal; setting a relative phase position between the modified output signal of the harmonic generator converter and the output signal of the linear converter; and combining the modified output signal of the harmonic generator converter and the output signal of the linear converter subsequent to said step of setting a relative phase position.

2. Method as defined in claim 1 wherein said step of setting the operating point is carried out by attenuating, by means of an attenuation member, the signal applied to at least one input of the harmonic generator converter.

3. Method as defined in claim 1 or 2 wherein said step of suppressing is carried out by adding part of the output signal to the linear converter in phase opposition to the output signal of the harmonic generator converter.

4. A circuit arrangement for compensating nonlinearities of a transmission member of a radio relay transmission system, said arrangement comprising: a linear converter having a linear gain characteristic and provided with two inputs and an output; a harmonic generator converter having a nonlinear gain characteristic and provided with two inputs and an output; means for supplying an intermediate frequency signal modulated with a useful signal to a first input of each said converter and for applying a local oscillator signal to the second input of each said converter, for causing the output of each converter to provide a radio frequency output signal modulated with the useful signal; means connected for setting the operating point of said harmonic generator converter in a manner to cause its output signal to be essentially composed of components corresponding to the useful signal and to third order intermodulation products thereof; signal splitting means having an input connected to receive the output signal from said linear converter, and having two outputs each providing a portion of the signal applied to its input; first coupler means having a first input connected to receive the output signal from said harmonic generator converter, a second input connected to a first output of said signal splitting means, and an output for providing an output signal in which the useful signal component in the output signal from said harmonic generator converter has been substantially suppressed, so that the signal at the output of said first coupler means contains essentially the third order intermodulation products component of the signal from the output of said harmonic generator converter; attenuation means connected to the output of said first coupler means for setting the amplitude of the signal at said first coupler output; phase shifting means connected in circuit with said attenuation means for setting a selected phase position between the signal at the output of said first coupler and the output signal of said linear converter; second coupler means having a first input connected to receive the signal passed by said phase shifting means and said attenuation means, a second input connected to the other output of said signal splitting means, and an output providing a predistorted radio frequency signal containing useful signal components and third order intermodulation products components derived from the intermediate frequency signal.

5. An arrangement as defined in claim 4 further comprising additional attenuation means connected to said first input of said harmonic generator converter and to said output of said harmonic generator converter.

6. An arrangement as defined in claim 4 or 5 wherein said signal splitting means presents a low forward attenuation between its input and its second output, and said second coupler means presents a low forward attenuation between its second input and its output.

7. An arrangement as defined in claim 6 further comprising second signal splitting means having an input connected to receive the local oscillator signal, a first output connected to supply the local oscillator signal to said second input of said harmonic generator converter, and a second output connected to supply the local oscillator signal to said second input of said linear converter, said second signal splitting means presenting a low forward attenuation between its input and its second output.

8. An arrangement as defined in claim 7 further comprising RF channel filters connected to the outputs of said converters.

9. An arrangement as defined in claim 7 wherein said converters are constructed to effect image frequency cancellation.

10. An arrangement as defined in claim 6 further comprising RF channel filters connected to the outputs of said converters.

11. An arrangement as defined in claim 6 wherein said converters are constructed to effect image frequency cancellation.

12. An arrangement as defined in claim 4 or 5 further comprising RF channel filters connected to the outputs of said converters.

13. An arrangement as defined in claim 4 or 5 wherein said converters are constructed to effect image frequency cancellation.

14. An arrangement as defined in claim 4 or 5 further comprising second signal splitting means having an input connected to receive the local oscillator signal, a first output connected to supply the local oscillator signal to said second input of said harmonic generator converter, and a second output connected to supply the local oscillator signal to said second input of said linear converter, said second signal splitting means presenting a low forward attenuation between its input and its second output.

* * * * *